(12) United States Patent
Okawa et al.

(10) Patent No.: US 11,123,960 B2
(45) Date of Patent: Sep. 21, 2021

(54) FILM MOLD AND IMPRINTING METHOD

(71) Applicant: DAI NIPPON PRINTING CO., LTD., Tokyo-to (JP)

(72) Inventors: Yasuhiro Okawa, Tokyo-to (JP); Hidenori Yoshioka, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 410 days.

(21) Appl. No.: 15/771,332

(22) PCT Filed: Oct. 14, 2016

(86) PCT No.: PCT/JP2016/080540
§ 371 (c)(1),
(2) Date: Apr. 26, 2018

(87) PCT Pub. No.: WO2017/073370
PCT Pub. Date: May 4, 2017

(65) Prior Publication Data
US 2018/0307136 A1    Oct. 25, 2018

(30) Foreign Application Priority Data
Oct. 26, 2015   (JP) .............................. JP2015-209940

(51) Int. Cl.
| | |
|---|---|
| *B32B 17/10* | (2006.01) |
| *B29C 59/02* | (2006.01) |
| *H01L 21/027* | (2006.01) |
| *G03F 7/00* | (2006.01) |
| *B29K 709/08* | (2006.01) |

(52) U.S. Cl.
CPC .............. *B32B 17/10* (2013.01); *B29C 59/02* (2013.01); *B32B 17/10064* (2013.01); *G03F 7/0002* (2013.01); *H01L 21/027* (2013.01); *B29K 2709/08* (2013.01)

(58) Field of Classification Search
None
See application file for complete search history.

(56) References Cited

U.S. PATENT DOCUMENTS 4,906,703 A  *  3/1990  Bolton .............. B32B 17/10018
                                                        428/412

FOREIGN PATENT DOCUMENTS

| JP | 2005-281101 A | 10/2005 |
|---|---|---|
| JP | 2011-240643 A | 12/2011 |
| JP | 5002422 B2 | 8/2012 |
| JP | 5215833 B2 | 6/2013 |

(Continued)

OTHER PUBLICATIONS

Machine English Translation of WO-2013147105-A1, accessed Apr. 7, 2020 (Year: 2013).*

(Continued)

*Primary Examiner* — Peter L Vajda
*Assistant Examiner* — Adrianna N Konves
(74) *Attorney, Agent, or Firm* — Oliff PLC

(57) ABSTRACT

A film mold according to the present embodiment includes a first resin layer having a pattern region including a concavo-convex pattern and constituted by a resin composition, and a first glass substrate layer constituted by thin film glass and laminated on a surface on an opposite side to a surface on which the pattern region is formed in the first resin layer.

10 Claims, 5 Drawing Sheets

(56) References Cited

FOREIGN PATENT DOCUMENTS

| WO | WO-2011145716 A1 | * | 11/2011 | ........... G03F 7/0002 |
| WO | 2013/147105 A1 | | 10/2013 | |
| WO | WO-2013147105 A1 | * | 10/2013 | ........... B29C 33/424 |
| WO | 2015-012161 A1 | | 1/2015 | |

OTHER PUBLICATIONS

Golaz et al, UV intensity, temperature and dark-curing effects in cationic photo-polymerization of a cycloaliphatic epoxy resin, Polymer, vol. 53, Issue 10, 2012, pp. 2038-2048. Retrieved from https://www.sciencedirect.com/science/article/pii/S0032386112002339. Accessed on Jul. 8, 2020. (Year: 2012).*

Su WF. (2013) Radical Chain Polymerization. In: Principles of Polymer Design and Synthesis. Lecture Notes in Chemistry, vol. 82. Springer, Berlin, Heidelberg. Retrieved from https://link.springer.com/chapter/10.1007/978-3-642-38730-2_7. Accessed on Jul. 8, 2020. (Year: 2013).*

Low, I. M.. Ceramic Matrix Composites—Microstructure, Properties and Applications—3.4 Properties of Glass/Glass-Ceramic Matrix Composites. Woodhead Publishing. Retrieved from https://app.knovel.com/hotlink/pdf/id:kt009AKWS3/ceramic-matrix-composites/properties-glass-glass. Accessed on Jul. 8, 2020. (Year: 2006).*

Machine English Translation of WO2011145716. Accessed Jul. 8, 2020. (Year: 2011).*

Machine English Translation of WO2013147105 (Year: 2013).*

Jun. 13, 2019 Search Report issued in European Patent Application No. 16859600.5.

May 1, 2018 International Preliminary Report on Patentability issued in International Patent Application PCT/JP2016/080540.

Dec. 6, 2016 International Search Report issued in International Patent Application No. PCT/JP2016/080540.

Jan. 28, 2021 Office Action issued in European Patent Application No. 16 859 600.5.

* cited by examiner

FILM MOLD AND IMPRINTING METHOD

TECHNICAL FIELD

Embodiments of the present disclosure relate to a film mold and an imprinting method.

BACKGROUND ART

In recent years, attention has been drawn to a pattern formation technique using imprinting as a pattern formation technique that replaces a photolithography technique. Imprinting is a pattern formation technique of, by using a mold having a pattern region including, for example, a fine concavo-convex pattern, transferring the concavo-convex pattern of the mold to a molding target material at the same magnification.

For example, imprinting using a photocurable resin composition as the molding target material is performed as follows. First, droplets of the photocurable resin composition are supplied to the surface of a transfer substrate. Next, the mold having the pattern region including a desired concavo-convex pattern and the transfer substrate are positioned in a predetermined state. Thereafter, the mold and the photocurable resin composition are brought into contact with each other to fill the concavo-convex pattern of the mold with the photocurable resin composition. In this state, light is radiated from the mold side to cure the photocurable resin composition, and thereby a resin layer is formed. Thereafter, the mold and the resin layer are pulled apart (mold releasing). Thereby, a pattern structure having a concavo-convex pattern in which the concavo-convex pattern in the pattern region of the mold is inverted is formed.

Molds used for such imprinting is roughly divided into hard molds formed of glass, quartz or the like and molds having flexibility (hereinafter referred to as film molds). Examples of the advantage of using a film mold among these is that, as a result of releasing of the mold being easy, it is easy to increase the area of the pattern region and the transfer region of the molding target material on which the pattern region is inverted, that reproducibility is high because entrainment (inclusion) of bubbles can be suppressed easily, and that manufacture can be performed at low cost. Conventionally, in the field of such film molding, various techniques have been proposed (for example, JP 5002422B, JP 5215833B, etc.).

SUMMARY OF INVENTION

Technical Problem

However, the conventional film mold is generally constituted by a resin composition, and its entirety and pattern are liable to be deformed due to its flexibility, material, and environmental factors such as temperature and humidity. Therefore, in the case where the film mold is deformed when positioning the film mold and the transfer substrate holding the molding target material in the predetermined state before the transfer, the film mold is undesirably displaced from the transfer substrate, and as a result, the positional accuracy of the pattern transferred onto the molding target material may be degraded in some cases. In particular, in the case of using imprinting in the manufacture of products in the fields of optics and semiconductors, the positional accuracy of the pattern transferred onto the molding target material greatly affects the performance of a finished product, and thus it is strongly desired to ensure good positional accuracy in the pattern to be transferred.

Embodiments of the present disclosure have been made in view of the above circumstances, and it is an object of the present invention to provide a film mold and an imprinting method capable of transferring a pattern of good positional accuracy onto a molding target material.

Solution to Problem

One embodiment of the present disclosure is a film mold including a first resin layer having a pattern region including a concavo-convex pattern and constituted by a resin composition, and a first glass substrate layer constituted by thin film glass and laminated on a surface on an opposite side to a surface on which the pattern region is formed in the first resin layer.

The film mold according to one embodiment of the present disclosure may further include a second resin layer constituted by a resin composition and laminated on a surface on an opposite side to a surface on the first resin layer side of the first glass substrate layer.

In this case, a contraction rate (shrinkage rate) of the resin composition constituting the first resin layer and a contraction rate (shrinkage rate) of the resin composition constituting the second resin layer may be the same.

In addition, in the film mold according to one embodiment of the present disclosure, one of the resin composition constituting the first resin layer and the resin composition constituting the second resin layer may be a radically polymerizable curable resin composition and the other may be a cationically polymerizable curable resin composition.

In addition, in the above-described case, in the film mold according to one embodiment of the present disclosure, the first glass substrate layer may be formed of a material having a tensile stress of 50 MPa or lower when bent into a state of a curvature radius of 150 mm or smaller. In particular, it is more preferable that the first glass substrate layer is formed of a material having a tensile stress of 50 MPa or lower when bent into a curvature radius of 75 mm or smaller.

In addition, the film mold according to one embodiment of the present disclosure may further include a second glass substrate layer laminated on a surface on an opposite side to a surface on the first resin layer side of the first glass substrate layer via an intermediate layer, and the second glass substrate layer may be constituted by thin film glass.

In this case, in the film mold according to one embodiment of the present disclosure, the first glass substrate layer and the second glass substrate layer may be formed of a material having a tensile stress of 50 MPa or lower when bent into a state of a curvature radius of 150 mm or smaller. In particular, it is more preferable that the first glass substrate layer and the second glass substrate layer are formed of a material having a tensile stress of 50 MPa or lower when bent into a curvature radius of 75 mm or smaller.

In addition, in the film mold according to one embodiment of the present disclosure, the first resin layer may have a non-pattern region in a region different from the pattern region, and an alignment mark may be provided in the non-pattern region.

In addition, it is preferable that a Young's modulus of a layer formed of glass included in the film mold according to one embodiment of the present disclosure is 75 GPa or lower.

In addition, one embodiment of the present disclosure is an imprinting method including a preparation step of preparing the film mold and a transfer substrate that holds a molding target material on one surface thereof, a positioning step of positioning the film mold and the transfer substrate in a predetermined state, a contact step of bringing the pattern region of the film mold into contact with the molding target material held on the transfer substrate, a curing step of curing the molding target material brought into contact with the film mold to form a transfer layer onto which a pattern corresponding to the pattern region has been transferred, and a release step of separating the transfer layer and the film mold from each other such that a pattern structure that is the transfer layer is positioned on the transfer substrate.

Advantageous Effects of Invention

According to the embodiment of the present disclosure, it is possible to transfer a pattern with good positional accuracy to the molding target material.

DESCRIPTION OF EMBODIMENTS

Figure 1:
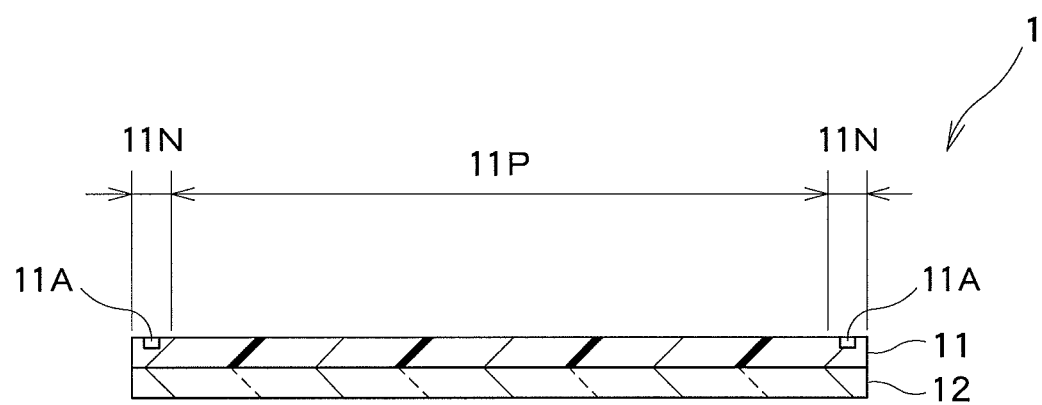
FIG. 1 is a cross-sectional view of a film mold according to a first embodiment.

Hereinafter, each embodiment of the present disclosure will be described with reference to the drawings. The drawings show examples, and features are exaggerated for illustrative purposes and are different from real features. To be noted, in the following drawings, the same reference numerals are attached to the same parts. In addition, it shall be interpreted that terms such as "parallel", "orthogonal", "same" and the like, values of length and angle, and the like which specify shapes, geometric conditions, and degrees thereof which are used in this specification include a range in which similar functions can be expected, without being bound by the strict meaning thereof.

First Embodiment

FIG. 1 is a cross-sectional view of a film mold 1 according to a first embodiment. This film mold 1 can be used for manufacturing products in various fields, and can be suitably used for manufacturing various products in the fields of, for example, semiconductors, optical elements, biotechnology, and the like. Hereinafter, the film mold 1 according to the first embodiment will be described in detail with reference to FIG. 1.

[Film Mold]

As shown in FIG. 1, the film mold 1 according to the present embodiment includes a first resin layer 11 constituted by a resin composition and having a pattern region 11P including a concavo-convex pattern (unevenness pattern) and a non-pattern region 11N on one surface thereof, and a first glass substrate layer 12 constituted by thin film glass and laminated on the other surface of the first resin layer 11 on the side opposite to the one surface on which the pattern region 11P is provided. This film mold 1 has flexibility enough to be usable for imprinting by a roller transfer method, but may be also used for imprinting of a method different from the roller transfer method.

As the resin composition constituting the first resin layer 11, a photocurable resin composition, a thermosetting resin composition, or a room-temperature curable resin composition is used in accordance with the formation method of the pattern region 11P. That is, in the first resin layer 11, the pattern region 11P is formed by contact with a concavo-convex pattern of a master (master mold), and the first resin layer 11 is fixed on the first glass substrate layer 12 by subsequent curing. Here, a photocurable resin composition is used in the case where photocuring is carried out after the contact with the concavo-convex pattern of the master, a thermosetting resin composition is used in the case where thermal curing is carried out, and a room temperature curable resin composition is used in the case where curing is carried out in room temperature.

When a photocurable resin composition is used as the resin composition constituting the first resin layer 11, a radically polymerizable ultraviolet curable resin composition, a cationically polymerizable ultraviolet curable resin composition, or the like may be used. Further, it is preferable that a material having heat resistance enough to allow baking treatment is used as the resin composition constituting the first resin layer 11. In the case where the baking treatment can be performed on the film mold 1, the process can be expected to be expanded and it is possible to improve the quality and the like, which is beneficial.

The thickness of the first resin layer 11 is preferably 20 μm or smaller from the viewpoint of securing flexibility high enough to be used for imprinting by the roller transfer method. In addition, as shown in FIG. 1, in the present embodiment, alignment marks 11A are provided in the non-pattern region 11N. The alignment marks 11A are formed, for example, in a concave shape, and it is preferable that a plurality of the alignment marks 11A are formed.

In the present embodiment, at the time of transfer, the concavo-convex pattern of the pattern region 11P and the non-pattern region 11N of the first resin layer 11 are configured to come into contact with a molding target material 103 (see FIGS. 2 and 3) positioned on one surface 101a of, in other words, held by, a transfer substrate 101 that will be described later. Prior to this contact, the film mold 1 and the transfer substrate 101 are positioned in a predetermined state. By using the alignment marks 11A at the time of this positioning, it can be confirmed whether or not the film mold 1 and the transfer substrate 101 are positioned in the predetermined state.

To be noted, in the present embodiment, the pattern region 11P refers to a part that transfers a pattern onto the molding target material 103 for the purpose of forming a pattern having a specific function on the molding target material 103, or for the purpose of forming an underlying part (resist pattern layer or the like) for forming a pattern having a specific function on the transfer substrate 101 on the molding target material 103. In contrast, the non-pattern region 11N formed in a region different from the pattern region 11P refers to a part to be brought into contact with the molding target material 103 without the above-mentioned purpose.

In addition, in the case where a photocurable resin composition is used as the molding target material 103 described above, it is preferable that the first resin layer 11 has light transmittance such that the light transmittance at a wavelength of 200 to 400 nm is 70% or higher. Measurement of light transmittance can be performed using V-650 manufactured by JASCO Corporation.

Meanwhile, in the present embodiment, the material of the first glass substrate layer 12 is not particularly limited as long as the material is thin film glass. The thickness of the first glass substrate layer 12 is preferably 200 μm or smaller and more preferably about 100 μm from the viewpoint of securing flexibility high enough to be used for imprinting by the roller transfer method. More specifically, it is preferable that the first glass substrate layer 12 is formed of a glass material having a tensile stress of 50 MPa or lower when bent into a state with a curvature radius of 150 mm or smaller, and in particular, it is more preferable that the first glass substrate layer 12 is formed of a material having a tensile stress of 50 MPa or lower when bent into a state with a curvature radius of 75 mm or smaller. The breaking stress of glass is generally 50 MPa, and in the imprinting of the roller transfer method, the film mold is often bent to a curvature radius of 150 mm or smaller. Therefore, when the first glass substrate layer 12 is constituted by a material having a tensile stress of 50 MPa or lower when bent to a curvature radius of 150 mm or smaller, more preferably 75 mm or smaller, the film mold 1 can be effectively used in the imprinting of the roller transfer method.

To be noted, the above tensile stress a can be calculated by $\sigma=(E \cdot T/2)/R$. E is the Young's modulus (GPa), T is the thickness (mm) of the first glass substrate layer 12, and R is the curvature radius (mm). Here, the Young's modulus of the glass material having a tensile stress of 50 MPa when bent into a state with a curvature radius of 150 mm and having a thickness of 200 μm is 75 GPa. Since the higher the Young's modulus is, the higher the tensile stress at bending is, the first glass substrate layer 12 is preferably formed of a material having a Young's modulus of 75 GPa or lower.

In the case where a photocurable resin composition is used as the molding target material 103 described above, it is preferable that the first glass substrate layer 12 has light transmittance such that the light transmittance at a wavelength of 200 to 400 nm is 70% or higher so that the molding target material 103 can be cured through the first glass substrate layer 12 and the first resin layer 11.

[Imprinting Method]

Figure 2:
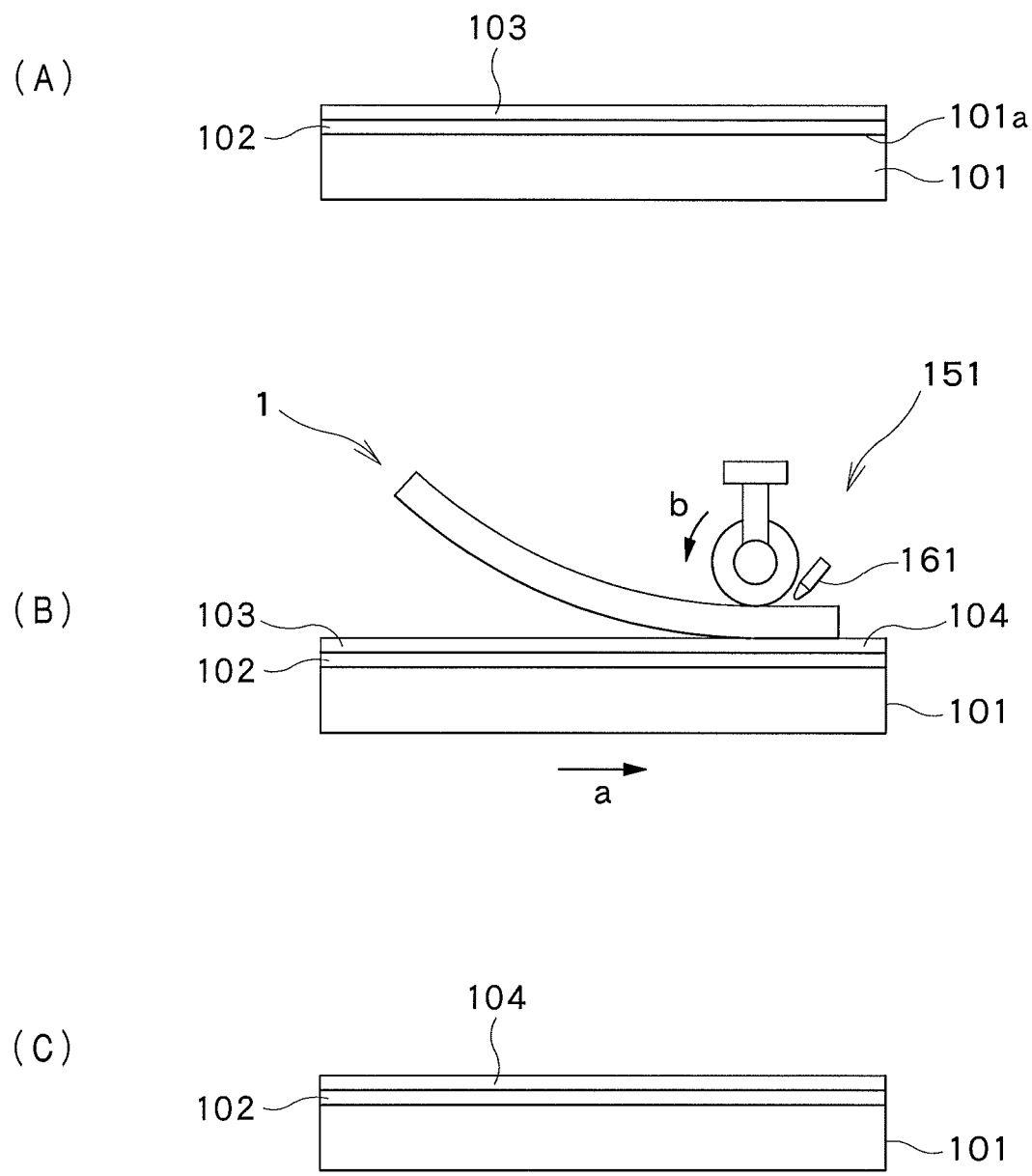
FIG. 2 is a process chart of an imprinting method according to the first embodiment.
Figure 3:
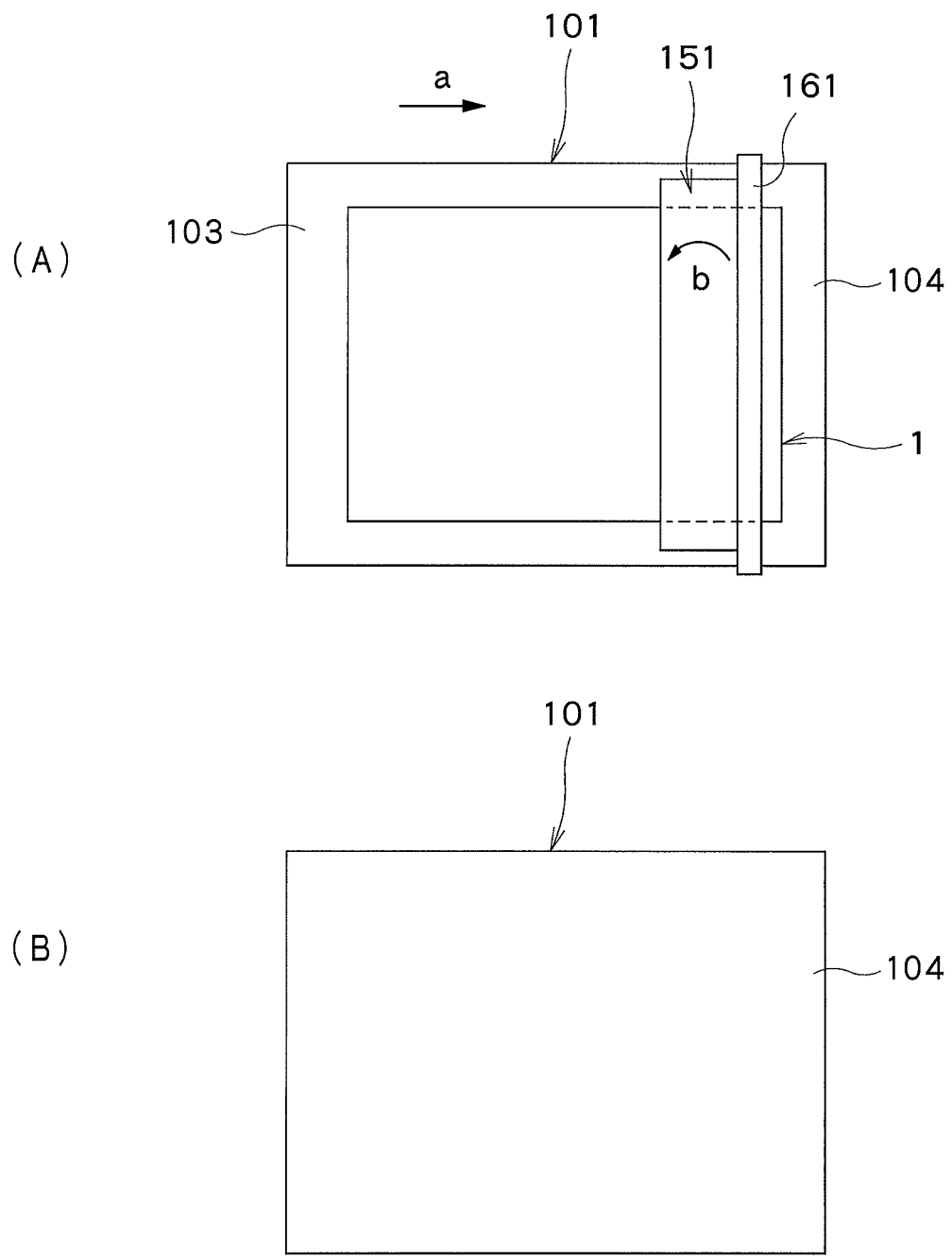
FIG. 3 is a process chart of an imprinting method according to the first embodiment.

Regarding the imprinting method according to the first embodiment using the above-described film mold 1, specifically, the imprinting of the roller transfer method using the photocurable resin composition as the molding target material 103, will be described below with reference to FIGS. 2 and 3.

<Preparation Step>

In the present embodiment, first, the film mold 1 shown in FIG. 1 is prepared. Further, the transfer substrate 101 shown in FIG. 2(A) is prepared. In the transfer substrate 101, an etching target layer 102 is provided on one surface 101a of the transfer substrate 101, and the molding target material 103 is positioned on, in other words, held on, the etching target layer 102.

The transfer substrate 101 used here can be appropriately selected and examples thereof include glasses such as quartz, soda-lime glass, and borosilicate glass; semiconductors such as silicon, gallium arsenide, and gallium nitride; resin substrates such as polycarbonate, polypropylene, and polyethylene; metal substrates; and composite material substrates constituted by a combination of these materials. Further, for example, a fine wiring used for a semiconductor, a display, or the like, or a desired pattern structure such as a photonic crystal structure or an optical structure such as an optical waveguide or holography may be formed therein. Further, the etching target layer 102 may be a thin film made of a material required as a material of a pattern to be formed on the transfer substrate 101, and can be appropriately selected from, for example, an inorganic thin film, an organic thin film, and an organic/inorganic composite thin film, or the like.

The molding target material 103 can be formed by a known coating means such as a spin coating method, a dispensing coating method, a dip coating method, a spray coating method, an inkjet method, or the like using, for example, a photocurable resin composition or a thermosetting resin composition. As described above, in the present embodiment, as an example, a photocurable resin composition is used as the molding target material 103. The thickness of the molding target material 103 can be determined in consideration of the height of a convex portion of the pattern region 11P of the film mold 1 to be used, the depth of a concave portion therebetween, and an acceptable range of the thickness of a residual film (position between the convex pattern) generated in a pattern structure to be formed, and the like.

<Positioning Step>

Next, the film mold 1 and the transfer substrate 101 are positioned in a predetermined state. Specifically, in the present embodiment, the film mold 1 and the transfer substrate 101 are positioned such that a predetermined portion of the non-pattern region 11N of the film mold 1 is pressed against a predetermined portion of the transfer substrate 101 by a roller 151 shown in FIGS. 2(B) and 3(A) on a surface of the first glass substrate layer 12 opposite to the first resin layer 11 side of the film mold 1. In this state, the film mold 1 extends obliquely outward from the pressed portion. In the present embodiment, in this positioning, whether or not the predetermined portion of the non-pattern region 11N of the film mold 1 is accurately pressed against the predetermined portion of the transfer substrate 101 can be confirmed by using the alignment marks 11A.

<Contact Step>

After the positioning, in the present embodiment, the pattern region 11P of the film mold 1 is continuously brought into contact with the molding target material 103 (FIGS. 2(B) and 3(A)) by conveying the transfer substrate 101 in the direction of arrow a shown in FIG. 2(B) and rotating the roller 151 in the direction of arrow b shown in FIG. 2(B).

<Curing Step>

Subsequently, the molding target material 103 in contact with the film mold 1 is cured, and thus a transfer layer 104 to which a pattern corresponding to the concavo-convex pattern of the pattern region 11P of the film mold 1 has been transferred is formed. In the examples shown in FIGS. 2(B) and 3(A), immediately after being brought into contact with the film mold 1, the molding target material 103 is irradiated with light from a light irradiation device 161 via the film mold 1, and thus the molding target material 103 is cured to form the transfer layer 104. Therefore, in this example, the first resin layer 11 and the first glass substrate layer 12 have optical transparency. However, instead of this, the transfer layer 104 may be formed by curing the molding target material 103 after the contact between the film mold 1 and the molding target material 103 is completed.

In addition, in the case where the transfer substrate 101 is light transmissive, the light irradiation device 161 may be disposed on the back side of the transfer substrate 101, and the molding target material 103 whose contact with the film mold 1 has been completed may be irradiated with light from the light irradiation device 161 through the transfer substrate 101 to cure the molding target material 103. Furthermore, curing of the molding target material 103 whose contact with the film mold 1 has been completed may be performed by using the light irradiation from the light irradiation device 161 through the film mold 1 and the light irradiation from the light irradiation device 161 through the transfer substrate 101 in combination.

<Release Step>

Subsequently, by separating the transfer layer 104 from the film mold 1, the pattern structure which is the transfer layer 104 is placed on the transfer substrate 101 (FIGS. 2(C) and 3(B)).

This separation of the transfer layer 104 from the film mold 1 can be performed after the contact of the film mold 1 with the molding target material 103 and the formation of the transfer layer 104 by curing of the molding target material 103 are completed. In addition, before the contact of the film mold 1 with the molding target material 103 is completed, the film mold 1 may be appropriately separated from the transfer layer 104 formed by curing the molding target material 103 which is already in contact with the film mold 1. Further, after the transfer layer 104 and the film mold 1 are separated from each other, additional exposure may be performed to completely cure the transfer layer 104.

Then, after that, a desired pattern can be formed on the transfer substrate 101 by removing the residual film as necessary from the pattern of a pattern structure 104 that is the transfer layer 104 formed as described above and etching the etching target layer 102 by use the pattern structure 104 as a mask. In addition, a concavo-convex pattern can be also formed on the transfer substrate 101 by etching the transfer substrate 101 by using a pattern thus formed as a mask.

In the film mold 1 according to the present embodiment described above, since good mechanical strength, heat resistance, and moisture resistance can be ensured by the first glass substrate layer 12, deformation caused by environmental factors such as the temperature and humidity at the time of and after manufacturing the film mold 1 can be prevented. As a result, at the time of positioning the transfer substrate 101, the film mold 1 being undesirably displaced with respect to the transfer substrate 101 due to the deformation can be prevented. Therefore, it is possible to transfer a pattern with good positional accuracy to the molding target material 103.

Figure 4A:
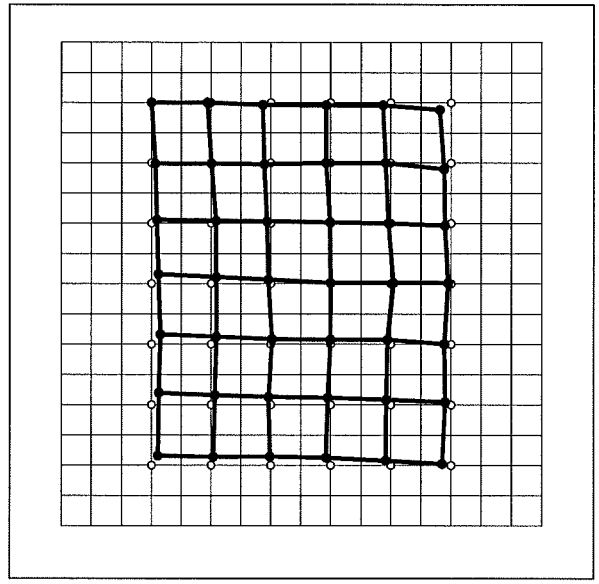
FIG. 4A is a diagram showing deviation between an actual pattern and a designed pattern, the actual pattern is a pattern that is transferred in a molding target material by the imprinting method according to the first embodiment.

FIG. 4A is a diagram exaggeratedly showing deviation between an actual pattern and a designed pattern, the actual pattern in FIG. 4A is a pattern that is transferred in the molding target material 103 by the imprinting method according to the first embodiment. In contrast, FIG. 4B is a diagram exaggeratedly showing deviation between an actual pattern and a designed pattern, the actual pattern in FIG. 4B is a pattern that is transferred in a molding target material by an imprinting method using a conventional film mold (consisting of a resin composition).

Figure 4B:
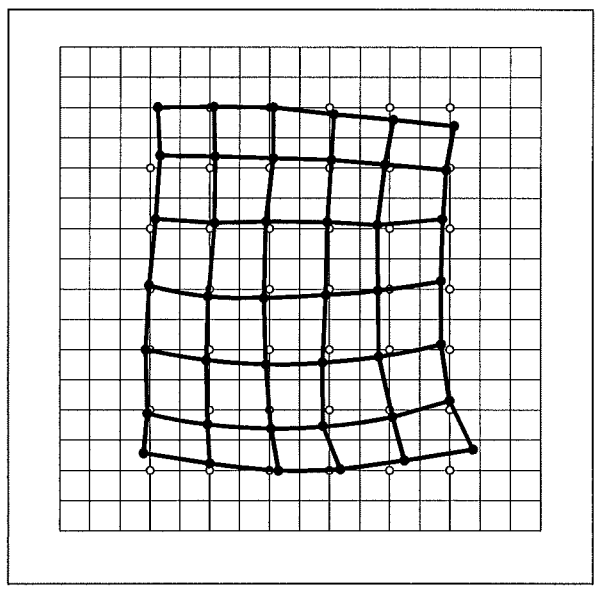
FIG. 4B is a diagram showing deviation between an actual pattern and a designed pattern, the actual pattern is a pattern that is transferred in a molding target material by an imprinting method using a conventional film mold.

In FIGS. 4A and 4B, each intersection point of a lattice indicated by a bold line indicates an observed point of the actual pattern, and each intersection point of a lattice indicated by a thin line shows a comparison point of the designed pattern with respect to the observed point. More coincidence of observed point with the comparison point indicates higher positional accuracy of a pattern. As obvious from contrasting FIGS. 4A and 4B, in the case of using the film mold 1 according to the present embodiment, it can be seen that it is possible to transfer a pattern with good positional accuracy as compared with the case of a conventional film mold. Specifically, it is confirmed that, in the case of using the film mold 1 according to the present embodiment, it is confirmed that the deviation between the observed point of the actual pattern and the comparison point of the designed pattern is about 2 μm at the maximum. In contrast, the deviation in the case of the conventional film mold is about 9 μm at the maximum.

Second Embodiment

Next, a second embodiment will be described. Constituent parts similar to those of the first embodiment in the present embodiment are denoted by the same reference numerals, and description thereof is omitted.

Figure 5:
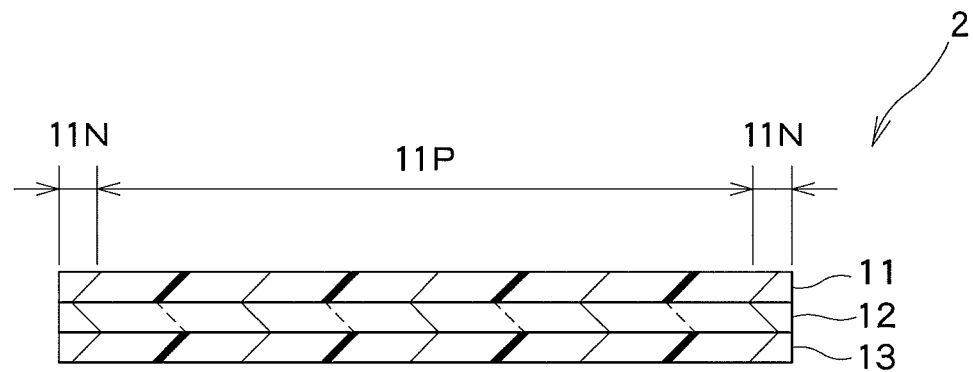
FIG. 5 is a cross-sectional view of a film mold according to a second embodiment.

As shown in FIG. 5, a film mold 2 according to the present embodiment includes the first resin layer 11 and the first glass substrate layer 12 similar to those of the first embodiment, and a second resin layer 13 constituted by a resin composition and laminated on a surface of the first glass substrate layer 12 opposite to the surface on the first resin layer 11 side. The first glass substrate layer 12 is more likely to break when the thickness thereof is smaller. The second resin layer 13 functions as a protective layer for protecting the first glass substrate layer 12 as described above.

As the resin composition constituting the second resin layer 13, various materials can be used. For example, in the case where the film mold 2 is used for imprinting by the roller transfer method, it is desired that the second resin layer 13 is formed flat because the second resin layer 13 is pressed by a roller. In the case of emphasizing such a demand, the second resin layer 13 may be constituted by a PET film made of polyethylene terephthalate (PET) as a resin composition. To be noted, in the case where the second resin layer 13 is formed from a film material, the second resin layer 13 may be bonded to the first glass substrate layer 12 via an adhesive layer.

In addition, the first resin layer 11 contracts when cured on the first glass substrate layer 12 after coming into contact with the concavo-convex pattern of the master, and the film mold 2 is sometimes deformed by this contraction. In order to effectively prevent such deformation, the second resin layer 13 may be formed on the first glass substrate layer 12 by curing a curable resin composition on the premise that a curable resin composition having the same contraction rate as that of the resin composition constituting the first resin layer 11 is used as the resin composition constituting the second resin layer 13. In this case, the deformation direction of the first resin layer 11 at the time of contraction and the deformation direction at the time of contraction of the second resin layer 13 are opposite to each other, and thus the deformation of the film mold 2 is suppressed. In this case, it is preferable that the volume (thickness and placement range) of the first resin layer 11 is equivalent to the volume (thickness and placement range) of the second resin layer 13.

To be noted, in the case where the first resin layer 11 is constituted by a photocurable resin composition, it is preferable that the second resin layer 13 is constituted by the same photocurable resin composition as that of the first resin layer 11. In the case where the first resin layer 11 is constituted by a thermosetting resin composition, it is preferable that the second resin layer 13 is constituted by the same thermosetting resin composition as that of the first resin layer 11. In the case where the first resin layer 11 is constituted by a room-temperature curable resin composition, it is preferable that the second resin layer 13 is constituted by the same room-temperature curable resin composition as that of the first resin layer 11.

In addition, one of the resin composition constituting the first resin layer 11 and the resin composition constituting the second resin layer 13 may be a radically polymerizable ultraviolet curable resin composition and the other may be a cationically polymerizable ultraviolet curable resin composition. In general, the contraction rate of the cationically polymerizable ultraviolet curable resin composition is smaller than the contraction rate of the radically polymerizable ultraviolet curable resin composition, but even with such a combination, deformation of the film mold 2 can be suppressed. Besides, since the material of the one side of the film mold 2 and the material of the other side are different, there is also an advantage that the function can be expanded.

In addition, in the case where a photocurable resin composition is used as the molding target material 103, it is preferable that the second resin layer 13 has light transmittance such that the light transmittance at a wavelength of 200 to 400 nm is 70% or higher so that the molding target material 103 can be cured through the first resin layer 11, the first glass substrate layer 12, and the second resin layer 13. In the case of securing light transmittance, the above-mentioned PET film or the like excellent in optical properties can be suitably used.

In addition, the thickness of the second resin layer 11 is preferably 20 μm or smaller from the viewpoint of securing flexibility high enough to be used for imprinting by the roller transfer method.

Also in the film mold 2 according to the present embodiment described above, since good mechanical strength, heat resistance, and moisture resistance can be ensured by the first glass substrate layer 12, deformation caused by environmental factors such as the temperature and humidity at the time of and after manufacturing the film mold 2 can be prevented. As a result, at the time of positioning the transfer substrate 101, the film mold 2 being undesirably displaced with respect to the transfer substrate 101 due to the deformation can be prevented. Therefore, it is possible to transfer a pattern with good positional accuracy to the molding target material 103. In addition, since the first glass substrate layer 12 can be protected by the second resin layer 13, prolongation of the lifetime of the film mold 2 can be suitably secured.

Third Embodiment

Next, a third embodiment will be described. Constituent parts similar to those of the first and second embodiments in the present embodiment are denoted by the same reference numerals, and description thereof is omitted.

Figure 6:
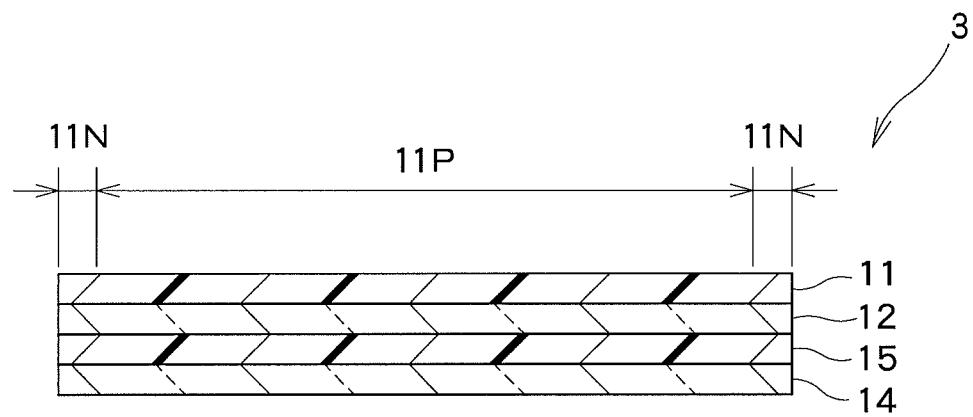
FIG. 6 is a cross-sectional view of a film mold according to a third embodiment.

As shown in FIG. 6, a film mold 3 according to the present embodiment includes the first resin layer 11 and the first glass substrate layer 12 similar to those of the first embodiment, and a second glass substrate layer 14 laminated on a surface of the first glass substrate layer 12 opposite to the surface on the first resin layer 11 side via an intermediate layer 15. The second glass substrate layer 14 is constituted by thin film glass.

The material of the second glass substrate layer 14 is not particularly limited as long as the material is thin film glass. The thickness of the second glass substrate layer 14 is preferably 200 μm or smaller and more preferably about 100 μm from the viewpoint of securing flexibility high enough to be used for imprinting by the roller transfer method. More specifically, it is preferable that the second glass substrate layer 14 is formed of a material having a tensile stress of 50 MPa or lower when bent into a state with a curvature radius of 150 mm or smaller, and in particular, it is more preferable that the second glass substrate layer 14 is formed of a material having a tensile stress of 50 MPa or lower when bent into a state with a curvature radius of 75 mm or smaller. In this case, it becomes possible to effectively use the film mold 3 in the imprinting by the roller transfer method. In addition, similarly to the first embodiment, it is preferable that the second glass substrate layer 14 is formed of a material having a Young's modulus of 75 GPa or lower. To be noted, the first glass substrate layer 12 in the present embodiment is the same as that described in the first embodiment.

Here, when the film mold 3 according to the present embodiment is bent, since the second glass substrate layer 14 is located further on the inside than the first glass substrate layer 12 and has a smaller curvature radius, the second glass substrate layer 14 is preferably set to have a smaller tensile stress at the time of bending than the first glass substrate layer 12. Therefore, for example, the first glass substrate layer 12 and the second glass substrate layer 14 may be constituted by the same material, and the thickness of the second glass substrate layer 14 may be smaller than the thickness of the first glass substrate layer 12.

In addition, in the case where a photocurable resin composition is used as the molding target material 103 described above, it is preferable that the intermediate layer 15 and the second glass substrate layer 14 each have light transmittance such that the light transmittance at a wavelength of 200 to 400 nm is 70% or higher so that the molding target material 103 can be cured through the first resin layer 11, the first glass substrate layer 12, the intermediate layer 15, and the second glass substrate layer 14.

Although various materials can be used as the material constituting the intermediate layer 15, it is preferable that the intermediate layer 15 is configured as a layer constituted by a resin composition or the like formed of a material having a specific function such as a heat ray absorption property, a wavelength selection property a, light diffusion property, or the like.

In addition, in the case where a photocurable resin composition is used as the molding target material 103 and the molding target material 103 is cured through the first resin layer 11, the first glass substrate layer 12, the intermediate layer 15, and the second glass substrate layer 14, it is preferable that fine concave and convex (so-called moth-eye structure) are formed in the interface between the second glass substrate layer 14 and the intermediate layer 15 and the interface between the first glass substrate layer 12 and the intermediate layer 15 while securing the light transmittance as described above in the intermediate layer 15. When such a moth-eye structure is formed, reflection at each interface of the intermediate layer 15 is prevented, and thus it is possible to prevent impairment of optical characteristics.

In the film mold 3 according to the present embodiment described above, since good mechanical strength, heat resistance, and moisture resistance can be ensured by the first glass substrate layer 12 and the second glass substrate layer 14, deformation caused by environmental factors such as the temperature and humidity at the time of and after manufacturing the film mold 3 can be prevented effectively. As a result, at the time of positioning the transfer substrate 101, the film mold 3 being undesirably displaced with respect to the transfer substrate 101 due to the deformation can be prevented. Therefore, it is possible to transfer a pattern with good positional accuracy to the molding target material 103. In addition, since it becomes possible to provide the intermediate layer 15 between the first glass substrate layer 12 and the second glass substrate layer 14 and impart a specific function to this intermediate layer 15, the marketability of the film mold 3 can be increased.

Although respective embodiment has been described above, the present disclosure is not limited to the above-described embodiments, and various modifications can be made.

The invention claimed is:

1. A flexible film mold comprising:
a first resin layer having a pattern region including a concavo-convex pattern and constituted by a resin composition;
a first glass substrate layer constituted by thin film glass and laminated on a surface on an opposite side to a surface on which the pattern region is formed in the first resin layer; and
a second resin layer constituted by a resin composition and laminated on a surface on an opposite side to a surface on the first resin layer side of the first glass substrate layer,
wherein the first glass substrate layer is formed of a material having a tensile stress of 50 MPa or lower when bent into a state of a curvature radius of 150 mm or smaller, and
the first resin layer, the first glass substrate layer, and the second resin layer each have a light transmittance at a wavelength of 200 to 400 nm that is 70% or higher.

2. The flexible film mold according to claim 1, wherein a contraction rate of the resin composition constituting the first resin layer and a contraction rate of the resin composition constituting the second resin layer are the same.

3. The flexible film mold according to claim 1, wherein one of the resin composition constituting the first resin layer and the resin composition constituting the second resin layer is a radically polymerizable curable resin composition and the other is a cationically polymerizable curable resin composition.

4. A flexible film mold comprising:
a first resin layer having a pattern region including a concavo-convex pattern and constituted by a resin composition;
a first glass substrate layer constituted by thin film glass and laminated on a surface on an opposite side to a surface on which the pattern region is formed in the first resin layer; and
a second glass substrate layer laminated on a surface on an opposite side to a surface on the first resin layer side of the first glass substrate layer via an intermediate layer, the second glass substrate layer being constituted by thin film glass,
wherein the first glass substrate layer and the second glass substrate layer are formed of a material having a tensile stress of 50 MPa or lower when bent into a state of a curvature radius of 150 mm or smaller, and
the first resin layer, the first glass substrate layer, the second glass substrate layer, and the intermediate layer each have a light transmittance at a wavelength of 200 to 400 nm that is 70% or higher.

5. The flexible film mold according to claim 1, wherein the first resin layer has a non-pattern region in a region different from the pattern region, and an alignment mark is provided in the non-pattern region.

6. The flexible film mold according to claim 1, wherein a Young's modulus of a layer formed of glass included in the film mold is 75 GPa or lower.

7. An imprinting method comprising:
a preparation step of preparing the flexible film mold according to claim 1 and a transfer substrate that holds a molding target material on one surface thereof;
a positioning step of positioning the film mold and the transfer substrate in a predetermined state;
a contact step of bringing the pattern region of the film mold into contact with the molding target material held on the transfer substrate;
a curing step of curing the molding target material brought into contact with the film mold to form a transfer layer onto which a pattern corresponding to the pattern region has been transferred; and
a release step of separating the transfer layer and the film mold from each other such that a pattern structure that is the transfer layer is positioned on the transfer substrate.

8. The flexible film mold according to claim 4, wherein the first resin layer has a non-pattern region in a region different from the pattern region, and an alignment mark is provided in the non-pattern region.

9. The flexible film mold according to claim 4, wherein a Young's modulus of a layer formed of glass included in the film mold is 75 GPa or lower.

10. An imprinting method comprising:
a preparation step of preparing the flexible film mold according to claim 4 and a transfer substrate that holds a molding target material on one surface thereof;
a positioning step of positioning the film mold and the transfer substrate in a predetermined state;
a contact step of bringing the pattern region of the film mold into contact with the molding target material held on the transfer substrate;
a curing step of curing the molding target material brought into contact with the film mold to form a transfer layer onto which a pattern corresponding to the pattern region has been transferred; and
a release step of separating the transfer layer and the film mold from each other such that a pattern structure that is the transfer layer is positioned on the transfer substrate.

* * * * *